United States Patent [19]
Shen et al.

[11] Patent Number: 6,075,254
[45] Date of Patent: Jun. 13, 2000

[54] POLARIZATION INSENSITIVE/INDEPENDENT SEMICONDUCTOR WAVEGUIDE MODULATOR USING TENSILE STRESSORS

[75] Inventors: Paul H. Shen, North Potomac, Md.; Jagadeesh Pamulapati, Washington, D.C.; Mitra Dutta, Raleigh, N.C.

[73] Assignee: The United States of America as represented by the Secretary of the Army, Washington, D.C.

[21] Appl. No.: 09/047,021

[22] Filed: Mar. 24, 1998

Related U.S. Application Data

[60] Provisional application No. 60/073,925, Feb. 6, 1998.

[51] Int. Cl.[7] ..................... H01L 29/205; H01L 31/0304
[52] U.S. Cl. ............................ 257/21; 257/18; 257/184; 359/245; 359/248
[58] Field of Search ..................................... 359/245, 248; 257/18, 21, 184

[56] References Cited

U.S. PATENT DOCUMENTS

| | | | |
|---|---|---|---|
| 5,090,790 | 2/1992 | Zucker | 257/18 |
| 5,153,687 | 10/1992 | Ishihawa | 359/248 |
| 5,488,507 | 1/1996 | Nishimura | 257/18 |
| 5,579,331 | 11/1996 | Shen et al. | |
| 5,757,023 | 5/1998 | Koteles | 257/18 |

OTHER PUBLICATIONS

Wiedemann et al "MOVPE . . . MQW . . . Devices" *Journal of Crystal Growth* 170(1997) 117–121.
Magari, K. et al., "Polarization Insensitive Traveling Wave Type Amplifier Using Strained Multiple Quantum Well Structure," IEEE Photonics Technology Letters, vol. 2, No. 8, 556 (Aug. 1990).
Chen, Y. et al., "Polarization Independent Strained InGaAs/InGaAlAs Quantum–Well Phase Modulators," IEEE Photonics Technology Letters, vol. 4, No. 10, 1120 (Oct. 1992).
Shen, H. et al., "Bias Independent Heavy–and Light–Hole Degeneracy in InGaAs/InGaAsP Quantum Wells," Applied Physics Letters, vol. 72, No. 6 (Feb. 1998).

*Primary Examiner*—Jerome Jackson, Jr.
*Attorney, Agent, or Firm*—Michael Zelenka; George B. Tereschuk

[57] ABSTRACT

A semiconductor waveguide modulator that is polarization insensitive/independent at bias variations for any chosen wavelength. The modulator of the present invention employs a novel type of strained semiconductor quantum well (QW) structure that exhibits bias independent, heavy-hole and light hole degeneracy. This effect is achieved by inserting one or two thin layers of highly tensile, strained materials in a specific position within the QW. By adjusting the thickness and the position of the highly tensile strained layers, the quantum confined Stark effect (QCSE) for the heavy hole and light hole can be engineered separately to control the bias dependent polarization properties. The present invention has applications, for example, in optoelectronic devices in the areas of telecommunications, optical signal processing, scanning and displays.

10 Claims, 8 Drawing Sheets

POLARIZATION INSENSITIVE/ INDEPENDENT SEMICONDUCTOR WAVEGUIDE MODULATOR USING TENSILE STRESSORS

This application claims the benefit of U.S. Provisional Application No. 60/073,925, filed Feb. 06, 1998.

GOVERNMENT RIGHTS

The invention described herein may be manufactured, used, and licensed by or for the U.S. Government for governmental purposes without the payment to us of any royalties thereon.

BACKGROUND OF THE INVENTION

This invention relates to the field of semiconductor electro-optic devices. The present invention is intended to be used in areas such as telecommunications, optical signal processing, scanning and displays.

Standard designs for polarization insensitive semiconductor modulators that use uniform tensile strained quantum wells have limited insensitivity. They are only insensitive at particular applied voltages. This is important to note since modulators are bias dependent devices. Modification of the quantum well structure in these semiconductor modulators changes the optoelectronic properties of these modulators. Moreover, modification of the band structure, in particular, in semiconductor quantum wells can lead to significant improvement in the performance of many semiconductor optoelectronic devices. The electric field within the quantum wells plays a significant role in changing the optical properties of semiconductor waveguide modulators. Quantum well structures exhibit a large field induced refractive index and absorption change due to the Quantum Confined Stark Effect (QCSE). Performance of optical switches and modulators depend upon the properties of the semiconductor quantum well structures.

The properties achieved by modifying the band structure in semiconductor quantum wells can make semiconductor quantum well waveguide switches/modulators polarization dependent. This, polarization dependence, is an undesirable property in optical communication applications where polarization preserving optical fiber cannot be used. Therefore, a polarization insensitive/independent semiconductor waveguide switch/modulator is desirable.

It has been suggested in the art that polarization insensitivity can be achieved in quantum well structures by merging the first heavy hole (HH) subband and the first light hole (LH) subband in a uniformly tensile strained quantum well. In this case, polarization independence can be achieved at a particular bias. It has also been suggested in the prior art that tensile strained barriers can produce similar results.

Although it has been suggested that polarization insensitive properties can be achieved in a tensile strained quantum well, to date, these properties are bias dependent. This is due to the fact that the first HH subband and first LH subband have different sensitivities to the QCSE.

The need exists for the fabrication and design of true polarization insensitive/independent semiconductor waveguide modulators that are insensitive to bias variations at any chosen wavelength. The present invention provides for these true polarization insensitive/independent semiconductor waveguide modulators that have greater utility and insensitivity. The invention allows the semiconductor waveguide modulator to be insensitive to bias variations. The unique bias independent polarization properties of the present invention have important applications in optoelectronic devices.

BRIEF DESCRIPTION OF THE INVENTION

The subject matter of the present invention relates to the field of semiconductor electro-optic devices. In particular, the invention herein relates to semiconductor waveguide modulators, wherein the properties of the modulators are such that they are polarization insensitive/independent at bias variations for any chosen wavelength. The invention herein is accomplished by the use of select tensile stressor materials positioned within a quantum well structure.

The present invention employs a novel type of strained semiconductor is quantum well (QW) structure that exhibits bias independent, heavy-hole and light-hole degeneracy. This effect is achieved by inserting one or two thin layers of highly tensile strained materials, also referred to herein as stressor materials, into a specific quantum well. Any material which has a lattice constant smaller or less than the lattice constant of the substrate employed in the specific QW semiconductor waveguide modulator, and that results in a tensile strain within the QW may be used as the highly tensile strained material herein. For example, suitable highly tensile strained materials within the scope of the present invention include gallium arsenide (GaAs), aluminum arsenide (AlAs) or gallium phosphide (GaP) when an InP or GaSb substrate is employed. By adjusting the thickness and the position of the layer(s) of highly tensile strained materials, also referred to herein as stressor layers, tensile stressor layers and highly strained layers, the desired properties can be achieved. If it is determined that the position of the stressor layer should be in the center of the QW, a single thin highly strained layer may be employed herein. If the stressors are to be positioned in a location other than the center of the QW, two thin highly strained layers are employed. Their positions in the QW are symmetrical within the QW structure.

The invention is directed to a semiconductor waveguide modulator employing the quantum well structure generally described above. The modulator within the scope of the present invention, for example, comprises a substrate having a lower cladding layer mounted on the substrate. On the lower cladding layer is mounted a lower confinement layer upon which is mounted the quantum well structure set forth above. An upper confinement layer is mounted on the quantum well layer, followed by an upper cladding layer. Both the lower cladding layer and the upper cladding layer are adjacent to a bottom contact and top contact layer, respectively. The bottom contact is grounded; while biasing voltage connects to the top contact layer.

Accordingly, it is an object of the present invention to provide a true polarization insensitive/independent semiconductor waveguide modulator that is insensitive to bias variations.

A further object of the present invention is to provide a novel type of strained semiconductor quantum well structure that exhibits true polarization independence (bias independent heavy hole and light hole degeneracy).

It is yet a further object of the present invention to provide a novel semiconductor waveguide modulator having unique bias-dependent polarization properties that have important applications in optoelectronic devices when specific polarization properties are required.

Still a further object of the present invention is to provide a semiconductor waveguide modulator having broad and diverse utility in the telecommunications industry, optical signal processing arena, as well as in the scanning and display art areas.

The means to achieve these and other objectives of the present invention will be apparent from the following detailed description of the invention, drawings and claims.

BRIEF DESCRIPTION OF THE DRAWINGS

The present invention will be described with reference to the accompanying figures and drawings.

These figures will be more specifically described in the detailed description of the invention and in the specific embodiments of the invention.

DETAILED DESCRIPTION OF THE INVENTION

The present invention provides for novel semiconductor waveguide modulators having enhanced electro-optic properties. The modulators of the present invention are superior to those currently employed in the art in that they exhibit properties wherein they are polarization insensitive/independent at bias variations for any chosen wavelength.

In quantum well structure, polarization dependence between TE and TM modes arises due to the confinement energy difference between the heavy hole (HH) state and the light hole (LH) state at zero bias. Polarization dependence between TE and TM modes also arises due to the different rate of the Quantum Confined Stark Effect (QCSE) for the HH and LH.

Figure 3:
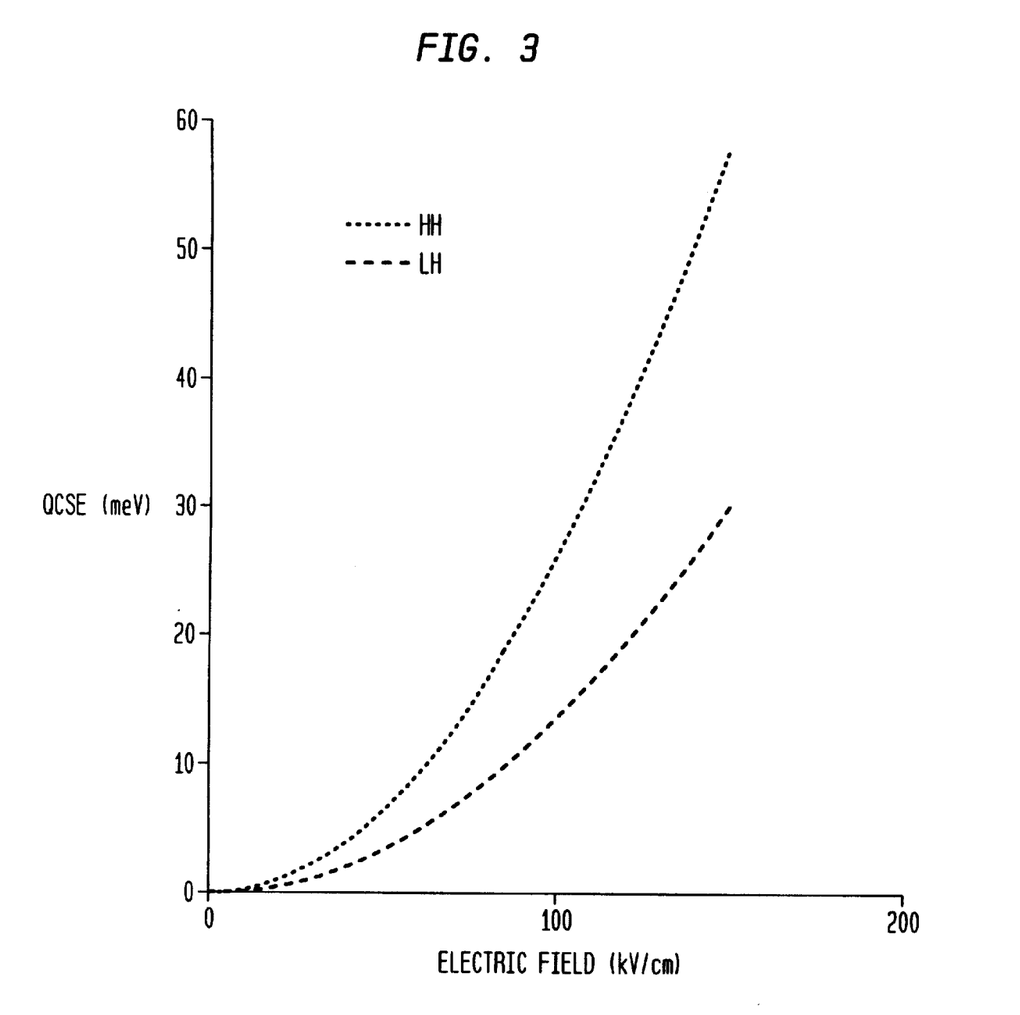
FIG. 3 is a plot of Quantum Confined Stark Effect (meV) versus Electric Field (kV/cm) for a heavy hole quantum well and a light hole quantum well when bias is applied. The quantum wells do not employ the present invention.

The confinement energy difference between the HH state and LH state at zero bias can be compensated for by inducing an appropriate amount of uniform tensile strain into the quantum well. This moves the energy of the LH state upwards to the same energy level of the HH state at zero bias. By doing this, polarization independence is achieved. However, when a voltage is applied, due to the QCSE, the HH state band moves faster than the LH band. This, in essence, is due to the heavier effective mass of the HH state resulting in polarization sensitivity at high bias, and can be seen in FIG. 3. Polarization sensitivity and dependence on bias variation is an undesirable property. The present invention helps solve this problem by providing a modulator that is polarization insensitive to bias variations.

The polarization insensitivity/independence at all operating biases is achieved in the present invention by providing a modulator that employs the QW described herein. The desired properties are achieved by using a QW having positioned therein one or two thin layers of highly strained materials having a specific thickness and position within the QW. If it is determined that the position of the stressor should be substantially in the center of the QW, a single thin highly strained layer is employed. If it is determined that the stressors are to be positioned in a location other than the center of the QW, two thin highly strained layers are employed with their positions being symmetrical within the QW structure. The type of QW employed is a factor in determining the location where the stressors are to be positioned therein.

The invention can be more specifically described with reference to FIGS. 1, 1A and 2.

Figure 1:
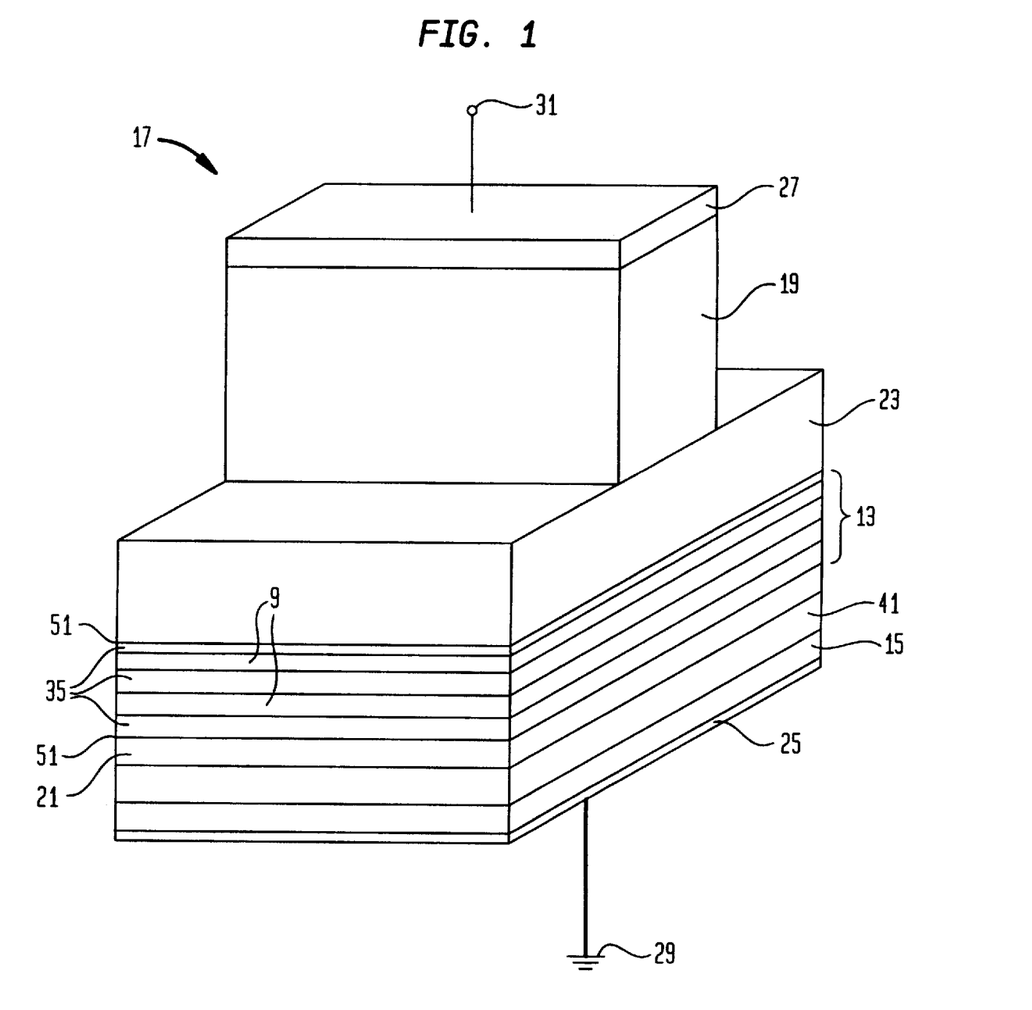
FIG. 1 is a schematic diagram of a preferred semiconductor waveguide modulator within the scope of the present invention.
Figure 1A:
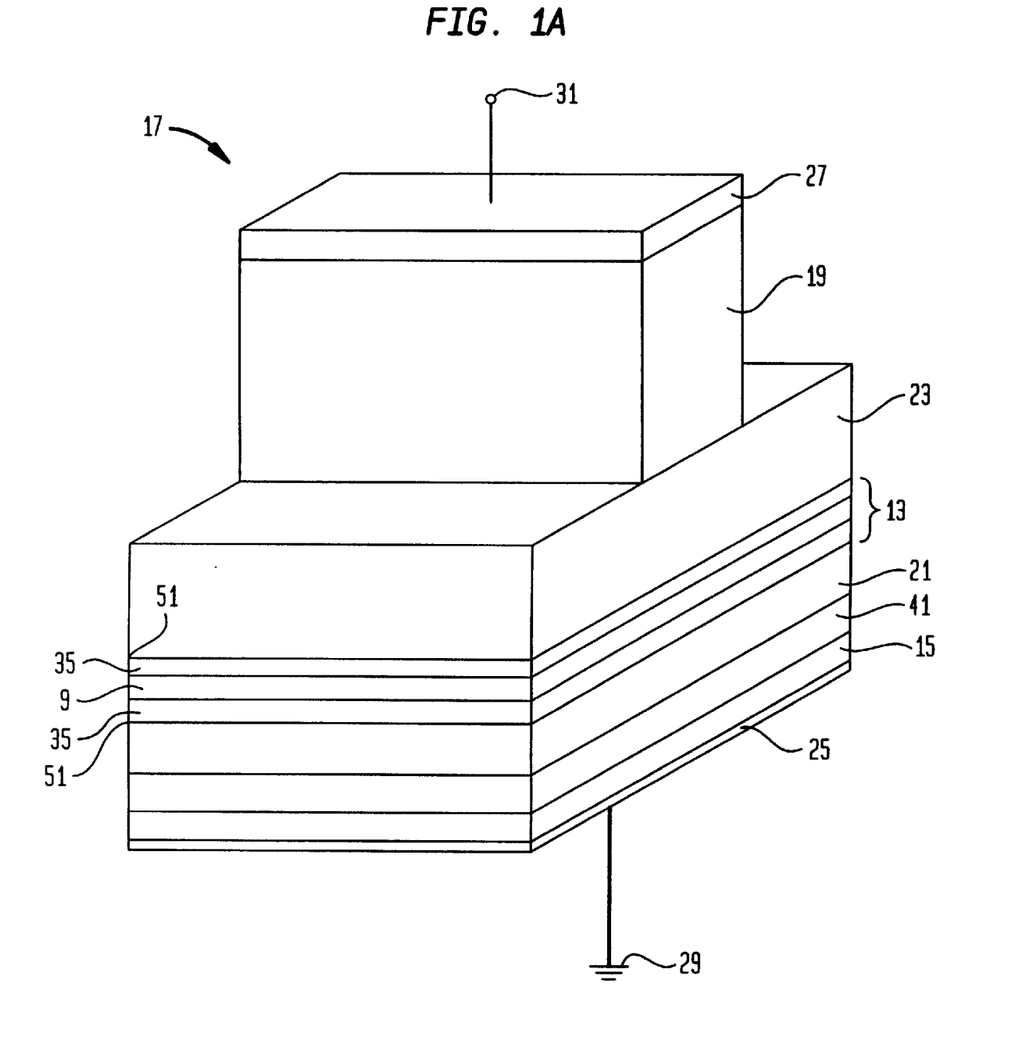
FIG. 1A is a schematic diagram of a variation within the scope of the present invention to the modulator structure set forth in FIG. 1.

FIG. 1 shows a schematic diagram (not to scale) of a semiconductor waveguide modulator 17 in accordance with the present invention. The modulator 17 includes a substrate 15 having lower cladding layer (n-material) 41 mounted thereon. On lower cladding layer 41 is present lower confinement layer 21, which has mounted on its upper surface quantum well structure 13 having quantum well material layers 35 and highly strained layers 9. On the upper surface of quantum well structure 13 is mounted upper confinement layer 23 upon which is stacked upper cladding layer (p-material) 19. Top contact 27 is located on the upper surface of upper cladding layer 19. Biasing voltage 31 connects to top contact 27. Substrate 15 rests on bottom contact 25, which connects to ground at 29.

Suitable materials, for illustration purposes only, that may be employed within the modulator 17 of FIG. 1 are as follows:

(a) When sulfur doped n-type InP is used for substrate 15, the lower cladding layer (n-material) 41 is preferably silicon doped n-type InP. Upper cladding layer (p-material) 19 would be beryllium, carbon or zinc doped p-type InP. Both the lower confinement layer 21 and the upper confinement layer 23 are preferably InGaAsP. The quantum well structure 13 as illustrated is lattice matched and comprises quantum well material layers 35 which are composed of InGaAs. The highly strained layers 9 are composed of GaAs. The lower confinement layer 21, the upper confinement layer 23 and the quantum well structure 13 are nominally undoped.

(b) When substrate 15 is composed of highly conductive doped n-type GaAs, the lower cladding layer (n-material) 41 is preferably doped n-type AlGaAs. Upper cladding layer (p-material) 19 would be doped p-type AlGaAs. Both the lower confinement layer 21 and the upper confinement layer 23 are preferably AlGaAs. The quantum well structure 13 as illustrated is lattice matched and comprises quantum well material layers 35 which are composed of GaAs. The highly strained layers 9 therein are composed of GaInP.

Quantum well structure 13 as depicted in FIG. 1 comprises five distinct layers of materials, namely three quantum well material layers 35 and two highly tensile strained layers 9. This five layer configuration may be used, for instance as set forth above, when the QW 13 used is lattice matched to the substrate 15. Use of a different type of QW, for example a non-lattice matched QW, may direct the skilled artisan to employ a three layer configuration QW. These three layer configurations are set forth in FIGS. 1A and 2. In a three layer configuration, a single highly tensile strained layer 9, as opposed to two highly tensile strained layers, may be used at the center of the QW 13 as set forth in FIG. 1A, or the two highly tensile strained layers may be employed within the QW, but at its extreme edge 51. This latter example is illustrated in FIG. 2.

When two highly tensile strained layers 9 are used, the distance from the QW structure edges 51 to each of the tensile strained layers 9 are the same. Moreover, the two tensile strained layers 9 are grown to have the same thickness. One skilled in the art will be able to determine how to practice the invention to determine the thickness of the highly tensile strained layers 9 to employ as well as their position. The thickness of the QW material layers 35, the semiconductor substrate layer 16, the upper and lower cladding layers, 19 and 41, respectively, and the lower and upper confinement layers, 21 and 23, respectively, to employ are well within the skill of the art.

Figure 2:
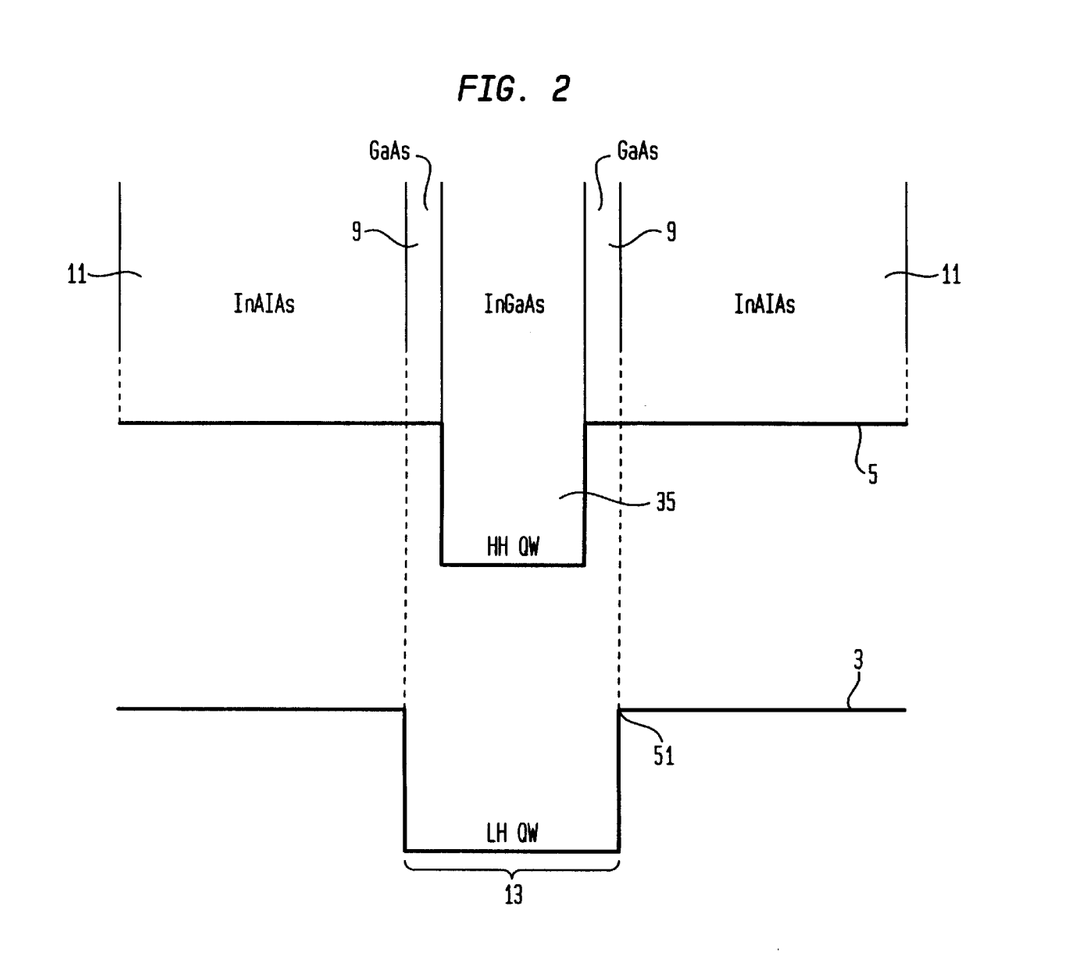
FIG. 2 is a schematic diagram of a non-lattice matched quantum well (QW) structure incorporating two tensile stressors within the scope of the present invention.

FIG. 2 is a schematic diagram of a non-lattice matched quantum well structure 13 within the scope of the present invention. The light hole quantum well (LHQW) is set forth at 3; and the heavy hole quantum well (HHQW) is set forth at 5. Two thin, highly tensile strained layers, also referred to herein as tensile stressors, 9 have been added at QW edge 51 within the quantum well structure 13 as shown. The strain necessary to achieve the desired properties described in the present invention is incorporated into the two, thin, highly tensile strained layers 9 that are inserted in the quantum well 13.

For illustration purposes only, the following specific materials and properties may be attached to the above quantum well structure 13 set forth in FIG. 2. The above quantum well structure 13, is comprised of strained InGaAs at 35. The two thin, highly tensile strained layers 9 are depicted as being grown at the edge 51 of the QW 13. These thin, highly tensile strained layers 9 are composed of GaAs having a width of three (3) monolayers. Two layers of InAlAs barrier layers 11 surround the GaAs highly strained thin layers 9.

As will be set forth below, other materials may be used for the quantum well structure 13 described. Moreover, the thickness of the tensile stressors 9 and their location within the quantum well structure 13 can vary depending on the type of QW employed and the specific need. If the location of the tensile stressor is to be in the center of QW 13, only one thin, highly tensile strained layer 9 would be used, as opposed to two. The specific materials identified to describe FIGS. 1 and 2 are for illustration purposes only.

The quantum well structures illustrated can be created by using molecular beam epitaxial growth by actuating the shutters of the composite materials. One can use any other conventional method of growing a QW structure, such as MOCVD, so long as the method provides for a means where the composite materials can be precisely varied.

Other materials which may be employed herein and that fall within the scope of the invention are as follows:

Suitable highly tensile strained materials, stressor materials, which fall within the scope of the present invention include gallium arsenide (GaAs), aluminum arsenide (AlAs), gallium phosphide (GaP), and any material which has a lattice constant smaller or less than the lattice constant of the substrate employed in the specific QW semiconductor waveguide modulator, and that results in a tensile strain within the QW may be used. Each tensile stressor layer employed within the scope of the present invention is to have a strain of approximately 1% to 4%; however, the tensile strain can be appropriately adjusted as needed based on the structure of the particular QW. The thickness of the tensile strain layer to provide the desired properties can vary and ranges from one (1) monolayer up to the critical thickness of the tensile stressor layer.

Substrates that may be used in the present invention may be any semiconductor substrate including, for example, any Group III–V substrates. Moreover, the quantum well, within the scope of the present invention, within which the thin layers of highly strained materials is inserted may be, for instance, lattice matched, nominally lattice matched or non-lattice matched.

One having ordinary skill in the art will be able to determine the appropriate tensile stressors, thickness of the tensile stressors and the appropriate tensile strain to employ within the scope of the present invention. Moreover, the location of where the tensile stressors within the scope of the present invention are to be grown within the specific QW structure can be determined by the skilled artisan. The distance away from the edge of the specific QW within which the tensile stressors may be grown can vary from the extreme edge of the QW to the center of the QW. The type of QW employed helps determine the location wherein the stressor layers are to be positioned.

The skilled artisan, using complex calculations and formulations well known in the art will be able to determine how to practice the present invention to determine the appropriate parameters (thickness, strain and location of tensile stressors) to use for a given quantum well structure. Reference to well known complex formulations within the art can be found at *Strained-Layer Supelattices: Physics*, Semiconductors and Semimetals Series, edited by Thomas P. Pearsall, Academic Press (1990). This reference is incorporated herein by reference.

The addition of the tensile stressor layer(s) within the scope of the present invention may be accomplished by molecular beam epitaxial growth (MBE), metal organic chemical vapor deposition (MOCVD), or any other method where the composite materials can be precisely grown and varied. In the present invention, conventional methods of producing QW structures may be employed. Generally, the tensile strain layers can be inserted into a QW structure by (1) initiating growth of the QW material on a suitable substrate; (2) stopping the growth of the QW material; (3) initiating growth of the tensile stressor; (4) stopping the growth of the tensile stressor; (5) initiating growth of the QW material; (6) stopping growth of the QW material; (7) initiating growth of the tensile stressor; (8) stopping growth of the stressor; and (9) initiating growth of the QW material. These steps may be performed, for example, during molecular beam epitaxial growth by actuating the shutters of the composite materials. These steps can be modified appropriately in the event that a single tensile strain layer is employed at the center of the QW. In the step-by-step method described, the QW materials employed are made up of the same material; and when two tensile stressors are employed, they too are of the same tensile material. One having ordinary skill in the art should be able to practice the present invention by employing methods well known in the semiconductor and QW art areas.

Figure 4:
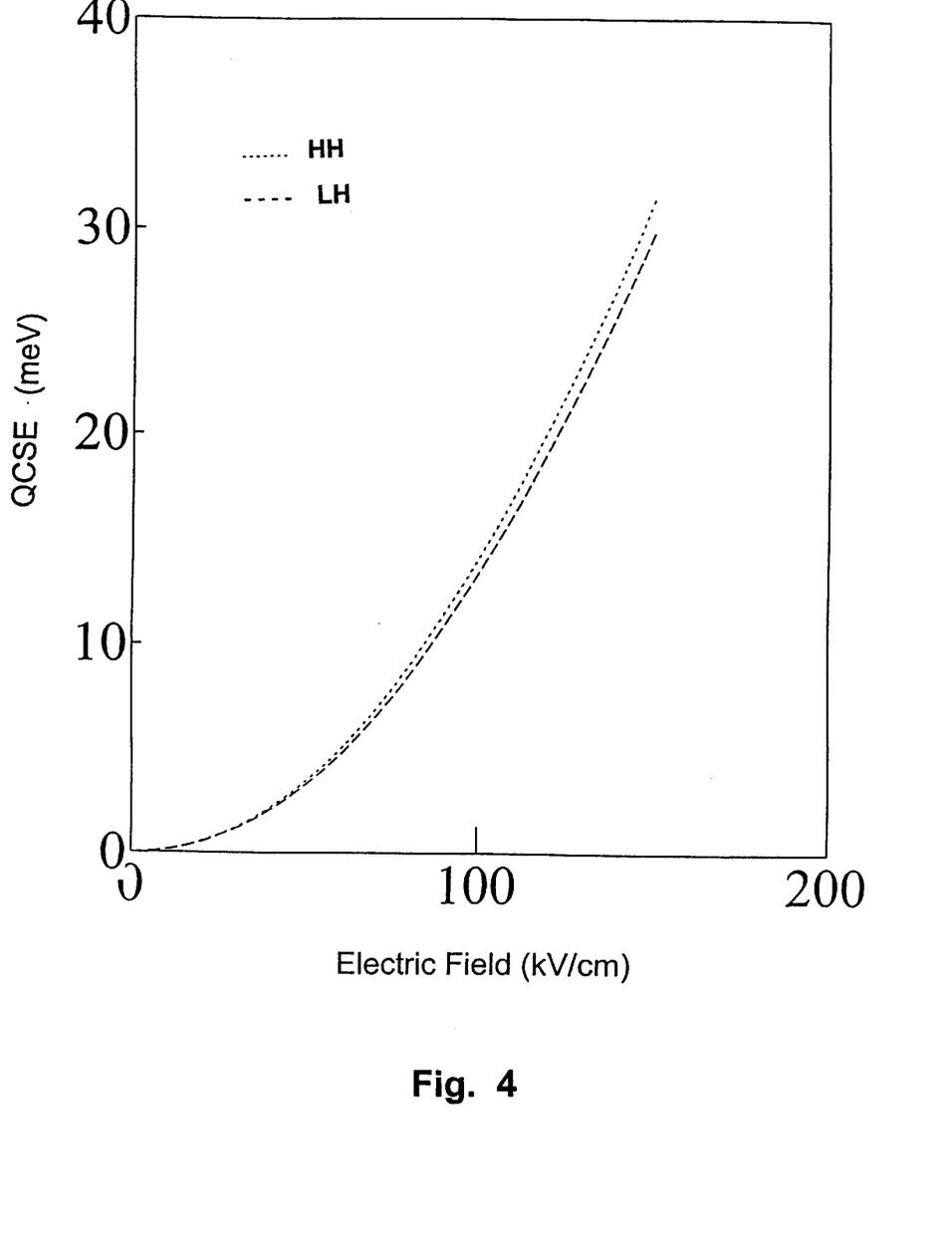
FIG. 4 is a plot of Quantum Confined Start Effect (meV) versus Electric Field (kV/cm) for a heavy hole quantum well and a light hole quantum well when bias is applied. This plot illustrates the effect of employing the tensile stressors within the scope of the present invention.

Analysis of the present invention based on the theory of strain in semiconductors, verifies the desired properties sought herein. Use of tensile stressors act as additional materials for the LH quantum well, but act as barrier materials for the HH quantum well. Hence, with use of the tensile stressors, the LH quantum well has a wider well width than the HH quantum well. Selection of the appropriate stressor width/thickness and the amount of desired strain sought, the rate of the QCSE in the LH band can be matched to the rate of the HH band. This desirable property is illustrated in FIG. 4. This result, which describes the present invention, provides for true polarization independent operation.

True polarization independent operation can now be achieved at all operating biases using one (if positioned in the center of the QW) or two thin, but highly strained layers in one quantum well. By use of the present invention, one will be able to engineer polarization insensitive/independent semiconductor waveguide modulators having desired properties.

Specific Embodiment

The present invention can also be described by the following specific embodiment:

A sample was grown using solid source molecular beam epitaxy. Five period multiple quantum wells consisting of 90 Angstroms lattice matched $In_{0.53}Ga_{0.47}As$ wells and 100 Angstroms lattice matched $Ga_{0.27}IN_{0.73}As_{0.57}P_{0.43}$ barriers with two, three (3) monolayer GaAs layers grown inside the $In_{0.53}Ga_{0.47}As$ quantum wells, 20 Angstroms away from the quantum well edges and were embedded in the intrinsic region of a p-i-n structure. The total thickness of the intrinsic region was 3,000 Angstroms. Upon analysis, it was determined that Pendellosung fringes are clearly observed in the symmetric (004) X-ray diffraction results indicating that GaAs monolayers do not adversely affect the crystallinity of the multiple quantum wells.

Experimental analyses of the novel, strained quantum well structures described in the preceding paragraph were conducted in order to examine their characteristic properties. FIGS. 5 through 8 illustrate the results of these analyses.

Linearly polarized photoluminescence (PL) was performed at room temperature by exciting the cleaved edge of a sample with an $Ar^{30}$ laser. Luminescence signals were collected from the cleaved edge. The front surface of the sample was covered, in a manner well known in the art, with a layer of gold in order to eliminate any photoluminescence normal to the surface of the sample itself. Spurious polarization dependence due to the spectrometer was avoided by orienting both the sample and the polarizer at 45° with respect to the entrance slit of the spectrometer.

Figure 5:
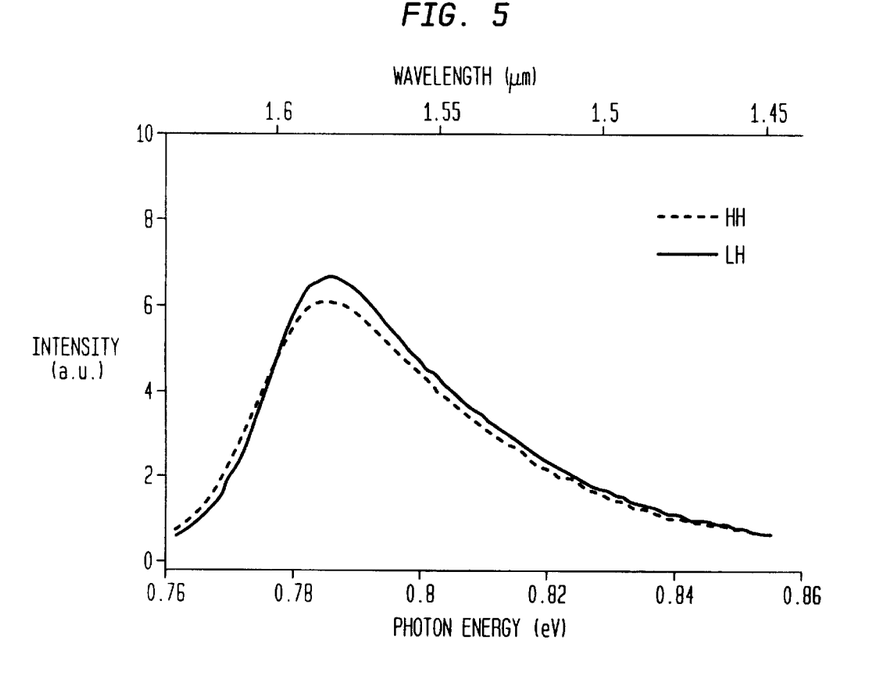
FIG. 5 is a graph of linearly polarized photoluminescence plotted at room temperature for a quantum well structure within the scope of the present invention. The solid line indicates the signal collected with the polarization parallel to the growth direction (z-direction) and the dashed line indicates the signal collected at a polarization perpendicular to the growth direction (xy-direction).

The results of the PL analysis conducted were plotted as set forth in FIG. 5. In FIG. 5, is shown, with solid and dashed lines, PL signals polarized parallel to the z-axis (growth direction) and along the xy-axis (in-plane direction), respectively. PL polarized parallel to the z-axis arises from electron to LH transitions, while PL polarized along the xy-axis primarily stems from electron to HH transitions. As set forth in FIG. 5, both polarizations peak at 1.58 $\mu$m with similar intensity, indicating degeneracy of the HH1 and LH1 at zero bias.

Tests were performed to study the bias dependence of the degeneracy. Linearly polarized electroabsorption (EA) measurements in total internal reflection mode (TIR) were performed. To perform this test, a sample as set forth above was cleaved along the (110) crystalline direction planes. The substrate, InP, was then polished to provide a small angle of approximately 1° with respect to the surface in order to avoid Fabry-Perot interference. Light from a standard tungsten lamp monochromator system was focused into one of the cleaved edges. A standard polarizer and polarization rotator combination was inserted between the monochromator and the sample to make the incident light linearly polarized along either the z-direction or the xy-direction. The light beam from the tungsten lamp monochromator system may have multiple internal reflections within the 3 mm length of the sample. The transmitted light that was exiting from the opposite cleaved edge was focused onto a standard photodetector. A DC voltage source was connected in series with a standard, small (100 mV), 400 Hz sine wave modulation source which also served as a reference to a lock-in amplifier. The current (voltages) from both were applied to the sample across the i-region. The AC signal ($\Delta T$) from a long wavelength photodetector was then normalized with its DC signal (T).

Figure 6:
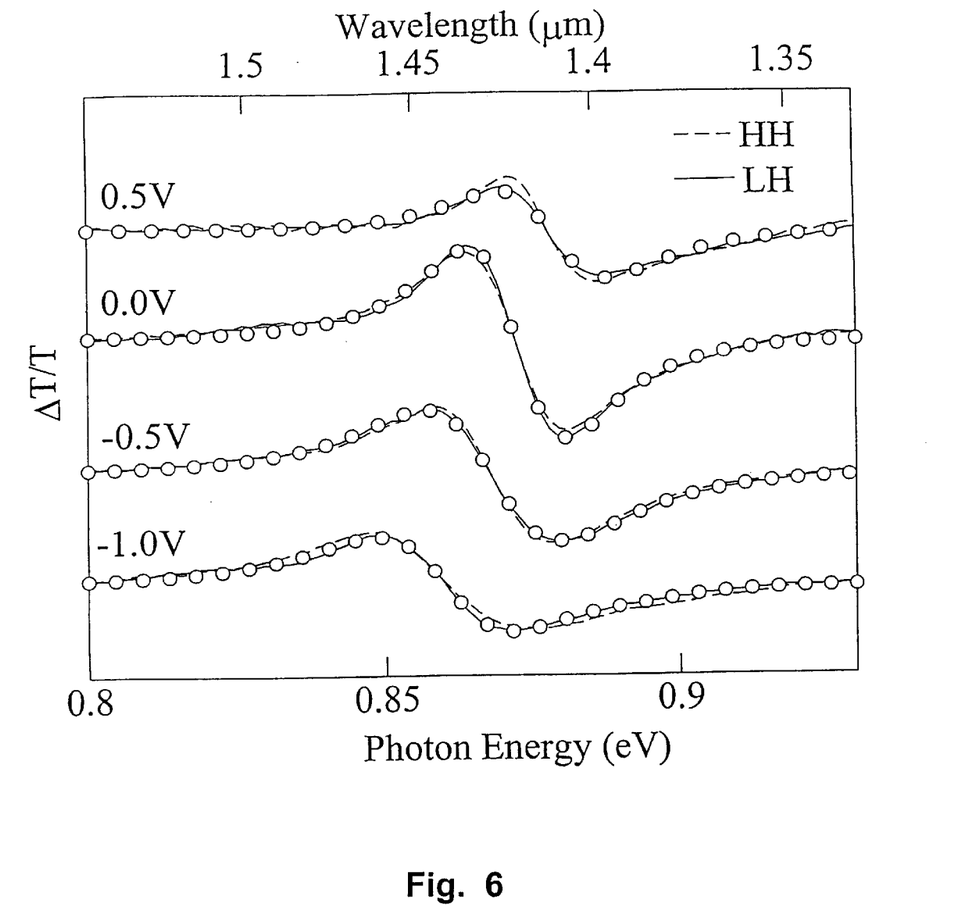
FIG. 6 is a graph of linearly polarized electroabsorption spectra at varying biases for a quantum well structure within the scope of the present invention. The solid line indicates illumination polarized parallel to the growth direction (z-direction) and the dashed line indicates illumination polarized perpendicular to the growth direction (xy-direction).

The results of these studies of the bias dependence of the degeneracy are set forth in FIG. 6. FIG. 6 shows low temperature electromodulation (TIR) spectra at varying bias, where positive voltage corresponds to forward biases; and negative voltage corresponds to reverse biases. The solid and dashed lines are for z-polarization and xy-polarization, respectively. A red shift as large as 25 meV has been observed. All features consist of a positive wing at lower energy followed by a negative wing at higher energy. Spectra measured at different polarizations and equal bias have almost identical lineshapes and amplitudes. This indicates a bias independent degeneracy and a polarization independent response to the electric field modulation.

Although the light beam used experiences multiple reflections from the sample-air interface, the change of the semiconductor refractive index due to the modulation does not change the reflectivity in the total internal reflection configuration. The major modulation component is from the modulation of the absorption. In a quantum well (QW), the major modulation mechanisms are the modulation of the energy gap due to the QCSE and the modulation of the oscillator strength due to the quenching of the exciton by an electric field. Line shape analysis was performed on the plot set forth in FIG. 6 using Lorentzian function. This analysis was performed based on the above considerations, which are suitable for low temperature excitonic absorption. The plot of small circles set forth in FIG. 6 is a fit to the z-polarization. There is agreement between the theory and the asymmetric experimental line shape resulting from the modulation of the oscillator strength.

Figure 7:
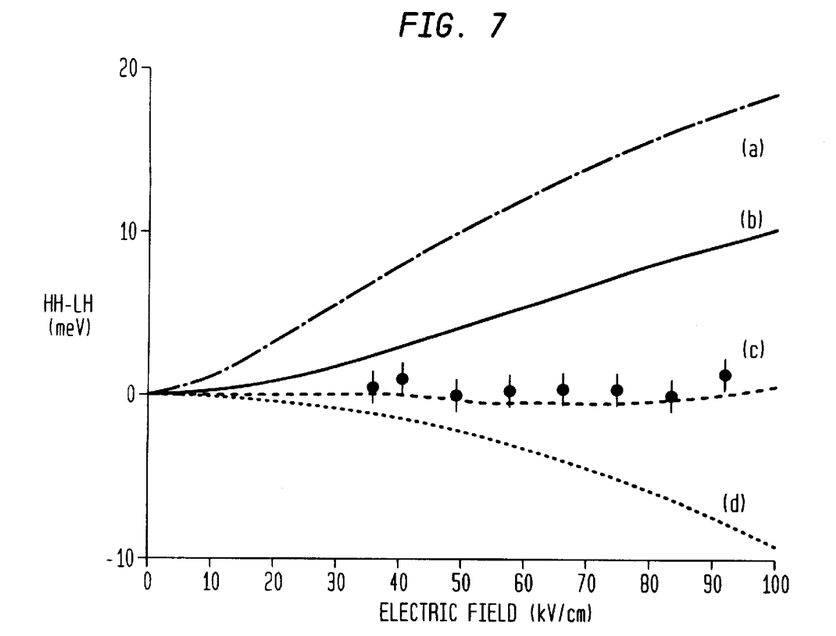
FIG. 7 is a graphic illustration of first heavy-hole subband (HH1) and first light-hole subband (LH1) separation (HH1-LH1) as a function of electric field for samples with highly tensile, strained layer(s) at various locations in a specific, lattice matched quantum well (QW): in sample (a), a strained layer is located at the middle of the QW; in sample (b), the control sample, there is no highly strained layer present within the QW; in sample (c), two highly strained layers are used, each located 20 Angstroms away from the edges of the QW (within the scope of the present invention); and in sample (d), two highly strained layers are used, each located at the edge of the QW.

Shown in FIG. 7 by small, solid circles and vertical error bars are the differences in the measured energy gap, in the QW structure above, for z-polarizations and xy-polarizations at various biases. For electric fields up to 100 kV/cm, the difference between them is within 1 meV. This illustrates excellent HH1 and LH1 degeneracy at different, varying biases and is within the scope of the present invention. These desirable properties are those achieved by the present invention. The specific experimental data set forth via plots in FIG. 7 will be described in greater detail below.

In a uniformly strained QW, the valence band potential profiles for the HH and LH are square wells with the same widths. To a first order approximation, the QCSE is proportional to the effective mass in the growth direction and to the fourth power of the well width. Since the HH has a larger effective mass along with growth direction, it experiences a stronger QCSE. The solid line (b) shown in FIG. 7 is the calculated result for a 120 Angstrom $In_{0.47}Ga_{0.53}As$ tensile strained QW, in which the difference in the HH1 and LH1 energy level can be as large as 10 meV. Solid line (b) is based on a control sample that does not contain the thin highly strained layers used in the present invention. The effect of not employing the stressor layers of the invention in QWs is clearly evident.

For the sample within the scope of the present invention, the well width for the HH and the LH are no longer the same. The valence band potential profiles for the HH and the LH are significantly different and can no longer be considered to be square wells. Thus, an effective well width can only be determined by considering the confinement of the wavefunction. In order to make this determination, a three-band kp calculation was performed. The type of calculations employed herein are well known in the art and may be found in *Strained-Layer Supelattices: Physics*, Semiconductors and Semimetals Series, edited by Thomas P. Pearsall, Academic Press (1990). The results of these calculations, the calculated band diagrams, confinement energies and wavefunctions, are set forth in FIG. 8. The solid line therein represents the results for the HH; whereas, the dotted line therein represents the results for the is LH. The dashed line set forth in this figure are the same quantities for the conduction band.

Figure 8:
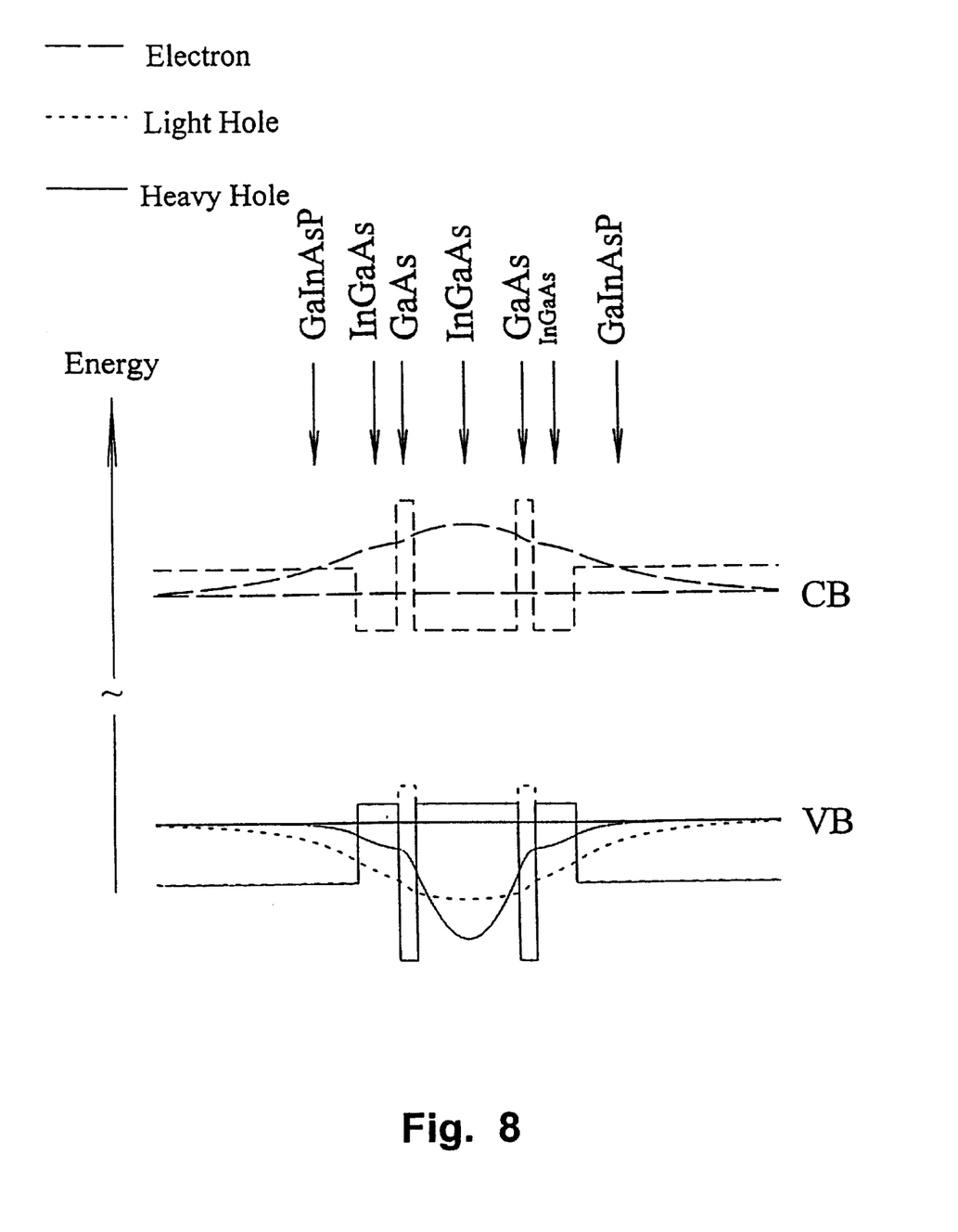
FIG. 8 sets forth conduction and valence band diagrams as well as wavefunctions for the first electron, HH1 and LH1 subbands within the scope of the present invention. Note that the LH1 wavefunction is confined within the entire InGaAs QW region between the barriers, while the HH1 wavefunction is mostly confined within the two highly strained GaAs layers.

FIG. 8 can further be described as follows: Within the scope of the present invention, the 3 monolayer GaAs layer, which is located 20 Angstroms away from the edge of the lattice matched QW edge, is under 3.8% tensile strain. The top of the valence band in this GaAs layer is split with the LH being at 247 meV above that of the HH. The strained GaAs LH band edge is near the LH band edge of the $In_{0.53}Ga_{0.47}As$ well material. This results in an effective LH width of approximately 106.8 Angstroms. This can also be seen from the LH1 wavefunction which extends throughout the entire QW region. Conversely, the strained GaAs HH band edge forms potential barriers that confine the HH width to an approximate 66.8 Angstroms region as indicated by the HH1 wavefunction. Generally, the LH band edge of the stressor layer is substantially the same as the LH band edge of the quantum well. Moreover, the HH band edge of the stressor is higher than the HH band edge of the QW.

Based on this discussion of FIG. 8, and in view of the fact that the QCSE, to a first order approximation, is proportional to the effective mass in the growth direction and to the fourth power of the well width, the larger LH effective width described above compensates for its smaller effective mass. As can be seen, this results in a bias independent degeneracy. The calculated energy separation as a function of applied field for the QW described above is plotted by a dashed line (c) in FIG. 7. This result is of the type intended by the present invention.

To further understand the effect of the use of the highly tensile, strained layers within the scope of the present invention, studies were conducted on the effect of their positions on the HH1 and LH1 QCSE. These studies were conducted to set forth the criticality of the structure of the QWs employed in the modulators within the scope of the present invention. The thickness of the GaAs layers was adjusted so as to keep the HH1 and LH1 degenerate at zero field. Then, two of these GaAs layers were grown at the edge of the lattice matched QW. Shown in FIG. 7 by short-dashed lines (d) is the HH1 and LH1 energy difference as a function of electric field for this QW. In this case, LH1 moves faster than HH1. The properties shown in this example are not within the scope of the invention.

To further understand the criticality of positioning of these highly tensile, strained layers, a single GaAs layer as described in the preceding paragraph, was next grown at the center, of the lattice matched QW. The result of this structure was plotted as a dashed-dotted line (a) in FIG. 7. One can note that the separation between HH1 and LH1 is larger than for the square well case, particularly at low field. The properties shown here do not show the desirable properties within the scope of the invention.

As can be seen from the description of FIG. 7, the position of the highly tensile, strained layers within a specific QW plays a significant role in achieving true polarization independence. For the QW described above, the position of the specific stressor layers at which the desired properties within the scope of the present invention are achieved is 20 Angstroms from the edge of the specific QW. It is important to note that although positioning the highly tensile strained layer at the edge and at the center of the specific QW employed above did not exhibit the desired bias independent HH1 and LH1 degeneracy, employing highly tensile strained layers at these positions within a different QW could, in fact, provide the desired properties and is within the scope of the present invention. One having ordinary skill in the art will now be able to engineer structures to provide the desired properties described herein.

It is possible and within the scope of the present invention to engineer the position of strained layers within a specific semiconductor QW so as to provide a modulator employing the QW to be polarization independent/insensitive at bias variations for any wavelength.

One skilled in the art, practicing the present invention, will be able to engineer novel semiconductor QW waveguide modulators that are polarization insensitive at bias variations. This can be accomplished by selecting a specific QW; determining the appropriate strained layers to use; determining the thickness of said layers; determining the appropriate positioning within the QW of the thin, highly tensile strained layers; and providing a QW structure employing these stressors into a semiconductor QW waveguide modulator.

From the growth considerations, additional benefits exist from incorporating all the strain into one or two thin, but highly strained, binary materials. Use of binary materials ensures that the desired amount of strain can be controllably achieved in the growth.

While particular embodiments of the present invention have been shown and described, it will be obvious to those skilled in the art that changes and modifications may be made without departing from the invention. Therefore, it is intended that the claims herein are to include all such obvious changes and modifications as fall within the true spirit and scope of this invention.

We claim:

1. A semiconductor waveguide modulator device comprising:
   a semiconductor substrate;
   a quantum well structure; and
   one or two thin layers of highly tensile strained materials, wherein said one or two thin layers of highly tensile strained materials are positioned within said quantum well structure so as to introduce tensile strain to said quantum well structure so as to render said modulator device polarization insensitive at bias variations.

2. The device of claim 1, wherein said quantum well structure has therein one thin layer of said highly tensile strained materials positioned substantially at the center of said quantum well structure.

3. The device of claim 1, wherein said quantum well structure has therein two thin layers of said highly tensile strained materials, wherein said two thin layers of said highly tensile strained materials are positioned symmetrically within said quantum well structure.

4. The device of claim 1, wherein said one or two thin layers of highly tensile strained materials have a lattice constant smaller than the lattice constant of said substrate.

5. The device of claim 1, wherein said one or two thin layers of highly tensile strained materials may be composed of materials selected from the group consisting of GaAs, AlAs, GaInP and GaP.

6. The device of claim 1, wherein said one or two thin layers of highly tensile strained materials have a thickness of from 1 monolayer up to the critical thickness of said highly tensile strained materials.

7. The device of claim 1, wherein said one or two thin layers of highly tensile strained materials each have a tensile strain of approximately 1% to 4%.

8. The device of claim 1, wherein said semiconductor substrate is selected from Group III–V elements.

9. The device of claim 8, wherein said semiconductor substrate may be selected from the group consisting of InP, GaAs and GaSb.

10. The device of claim 1, wherein said quantum well structure is lattice matched, nominally lattice matched or non-lattice matched.

* * * * *